United States Patent
Todd et al.

(10) Patent No.: US 7,582,510 B2
(45) Date of Patent: Sep. 1, 2009

(54) ELECTRONIC PACKAGING MATERIALS FOR USE WITH LOW-K DIELECTRIC-CONTAINING SEMICONDUCTOR DEVICES

(75) Inventors: Michael G. Todd, Anaheim Hills, CA (US); James T. Huneke, Irvine, CA (US); Lawrence N. Crane, Huntington Beach, CA (US); Gordon C. Fischer, Trabuco Canyon, CA (US)

(73) Assignee: Henkel Corporation, Rocky Hill, CT (US)

(*) Notice: Subject to any disclaimer, the term of this patent is extended or adjusted under 35 U.S.C. 154(b) by 0 days.

(21) Appl. No.: 10/595,736

(22) PCT Filed: Nov. 9, 2004

(86) PCT No.: PCT/US2004/037530

§ 371 (c)(1),
(2), (4) Date: May 8, 2006

(87) PCT Pub. No.: WO2005/048348

PCT Pub. Date: May 26, 2005

(65) Prior Publication Data

US 2008/0122088 A1    May 29, 2008

Related U.S. Application Data

(60) Provisional application No. 60/518,298, filed on Nov. 10, 2003.

(51) Int. Cl.
H01L 21/44    (2006.01)
H01L 21/48    (2006.01)
H01L 21/50    (2006.01)

(52) U.S. Cl. .................... 438/106; 438/108; 438/127

(58) Field of Classification Search ......... 438/106–109, 438/121–127, E23.001, E23.121
See application file for complete search history.

(56) References Cited

U.S. PATENT DOCUMENTS

| | | | |
|---|---|---|---|
| 5,140,404 | A | 8/1992 | Fogal et al. |
| 5,286,679 | A | 2/1994 | Farnworth et al. |
| 5,323,060 | A | 6/1994 | Fogal et al. |
| 5,447,988 | A | 9/1995 | Dershem et al. |
| 5,769,996 | A | 6/1998 | McArdle et al. |
| 5,851,644 | A | 12/1998 | McArdle et al. |
| 5,916,641 | A | 6/1999 | McArdle et al. |
| 6,110,399 | A | 8/2000 | McArdle et al. |
| 6,149,857 | A | 11/2000 | McArdle et al. |
| 6,224,690 | B1 | 5/2001 | Andricacos et al. |
| 6,402,876 | B1 | 6/2002 | McArdle et al. |
| 6,423,172 | B1 | 7/2002 | McArdle et al. |
| 6,465,893 | B1 | 10/2002 | Khandros et al. |
| 7,323,360 | B2 * | 1/2008 | Gonzalez et al. ............ 438/108 |

FOREIGN PATENT DOCUMENTS

| | | |
|---|---|---|
| JP | 2000-239627 | 9/2000 |
| JP | 2000-309768 | 11/2000 |
| JP | 2001-049220 | 2/2001 |

* cited by examiner

*Primary Examiner*—Cuong Q Nguyen
(74) *Attorney, Agent, or Firm*—Steven C. Bauman

(57) ABSTRACT

Electronic packaging materials for use with Low-k dielectric-containing semiconductor devices are provided.

12 Claims, 6 Drawing Sheets

ELECTRONIC PACKAGING MATERIALS FOR USE WITH LOW-K DIELECTRIC-CONTAINING SEMICONDUCTOR DEVICES

This U.S. patent application is a Provisional Application of 60/518,298, filed on Nov. 10, 2003.

BACKGROUND OF THE INVENTION

Low dielectric constant ("low-k") dielectric materials (or interlayer dielectric layers, "ILD's") play an important role in the future development of advanced integrated circuit manufacturing, enabling the use of copper interconnects in sub-0.18 micron fabrication processes. Low-k ILD's are used in integrated circuit manufacturing to insulate copper interconnects from their surroundings, ensuring less cross talk between interconnections. Cross talk is a common problem in integrated circuit manufacturing, as it causes malfunction in the circuit. Cross talk becomes even more pronounced as the size of the integrated circuit continues to shrink. The dielectric constant of conventional interlayer materials used in integrated circuit manufacturing ordinarily resides in the >3.0 range. However, with the continued increase in the density of inputs/outputs on a single chip, the cross talk concerns increase.

Thus, low-K ILD's having dielectric constants below about 2.5 are an important aspect of the design of integrated circuits to maximize the efficiency of ever more compact integrated circuits. One such material is known as Black Diamond, and is commercially available from Applied Materials.

Announcements within the industry indicating the trend to 0.09 micron, and even 0.065 micron, chip fabrication processes using low-k ILD's have been reported. Progress in that regard has been hampered to date, however, as chipmakers struggle with achieving acceptable package level reliability.

Conventional electronic packaging materials, such as low coefficient of thermal expansion ("CTE"), high modulus, epoxy-based molding compounds, encapsulants, die attach adhesive materials and underfill sealant materials appear to be incapable of providing the necessary protection against package stresses to prevent damage to the low-k ILD's. The low-k ILD's, being fragile in nature, are generally weaker and more brittle than conventional ILD materials, such as silicon oxides, silicon nitrides, fluorinated silicon glass, and the like, and as a result lead to fracture and cracks during thermal excursions due to induced stresses. The fracture and cracking translate into delamination when coupled with such conventional electronic packaging materials. (See FIG. 4). Significant research and development resources have been expended in an attempt to resolve the ILD cracking issues through packaging process adjustments and material property optimizations. Little progress has been reported to date, however, at reducing the internal package stresses that lead to the low-k ILD cracking failures.

It would be desirable therefore to provide an electronic packaging material suitable for advanced applications, such as underfill sealants materials, encapsulant materials, die attach adhesive materials and molding compounds, that are compatible for use with low-k ILD's and reduce the internal package stresses that lead to ILD cracking failures. In addition, it would be desirable to provide electronic packages assembled with such ILD's and provide methods of manufacturing such electronic packages that provide enhanced physical properties.

SUMMARY OF THE INVENTION

Generally, the present invention provides for reduced internal package stresses on electronic packages, such as described below.

Contrary to conventional wisdom in previous electronic packaging approaches, the present invention shows that a low modulus, high CTE epoxy-based material does not provide optimum stress reduction on the ILD in a semiconductor package. Rather, an optimized combination of modulus, CTE and Tg in an electronic packaging material is desirable to significantly reduce internal stresses developed within semiconductor packages assembled with the low-K ILD. The present invention provides electronic packaging materials capable of significantly reducing internal stresses developed within semiconductor packages assembled with the low-K ILD's by exhibiting a ratio of modulus versus temperature between $-65°$ C. and $125°$ C. in the range of $-10$ MPa/$°$ C. to about $10$ MPa/$°$ C., such as about $-7.5$ MPa/$°$ C.

In addition, whether or not the low-K ILD's are used in the semiconductor package, the present invention also confers the noted benefits and advantage to semiconductor packages having very thin semiconductor chips (such as less than 100 microns) and bond lines of less than 10 microns between the semiconductor chip and the circuit board.

The present invention thus provides in one aspect a method of improving reliability of an underfilled semiconductor device comprising at least one layer of low-k ILD. The steps of this method include:

providing a semiconductor device comprising:
  a semiconductor chip comprising copper electrical interconnections and at least one layer of low-K ILD therewithin; and
  a carrier substrate having electrical contact pads on a surface thereof to which the semiconductor chip is electrically interconnected;

providing a heat curable underfill composition between the electrically interconnected surfaces of the semiconductor chip and the carrier substrate to form a semiconductor device assembly; and exposing the semiconductor device assembly to elevated temperature conditions sufficient to cure the heat curable underfill composition.

In one embodiment, after the semiconductor chip and the carrier substrate are mated the heat curable underfill composition is provided by dispensing and filling the space therebetween to form the semiconductor device.

In another embodiment, the heat curable underfill composition is provided by dispensing onto at least a portion of an electrically interconnecting surface of one or both of the semiconductor chip or the carrier substrate, and the semiconductor chip and the carrier substrate are then mated to form the semiconductor device.

In this aspect, a semiconductor device is also provided as a flip chip assembly and comprises:

a semiconductor chip comprising copper electrical interconnections and at least one layer of low-K ILD therewithin;

a circuit board having electrical contact pads on a surface thereof to which the semiconductor chip is electrically interconnected; and an underfill composition between the semiconductor chip and the circuit board.

A semiconductor device assembly is also provided as a chip scale package and comprises:
  a semiconductor device comprising a semiconductor chip having copper electrical interconnections and at least one layer of low-K ILD therewithin, to which is electrically connected a carrier substrate;
  a circuit board having electrical contact pads on a surface thereof to which the semiconductor device is electrically interconnected; and
  an underfill composition between the semiconductor device and the circuit board.

A pre-applied underfill composition is further provided on an integrated circuit chip or a carrier substrate. The integrated circuit chip comprises a semiconductor chip having electrical contacts arranged in a predetermined pattern and capable of providing electrical engagement with the carrier substrate. Here, therefore, the pre-applied underfill composition comprises:
  a fluxing agent contacting the electrical contacts; and
  a heat curable underfill composition distinct from the fluxing agent and in contact with the chip die; and
  optionally, a thermosetting composition, reaction products of which are controllably degradable when exposed to appropriate conditions.

When present, the thermosetting composition is distinct from the fluxing agent and the heat curable underfill composition and is in contact with the heat curable underfill composition; and the electrical contacts are flowable to provide the electrical engagement with the carrier substrate, the heat curable underfill composition and, when present, the thermosetting composition are curable for adhering the circuit chip to the carrier substrate, and, when present, the thermosetting composition is controllably degradable to release the circuit chip from the carrier substrate.

And an integrated circuit chip assembly is provided in another embodiment of the preapplied underfill. Here, the integrated circuit chip assembly includes:
  a circuit board; and
  a semiconductor chip adhered to the circuit board through a heat curable underfill component and optionally, a thermosetting component, reaction products of the thermosetting component being controllably degradable when exposed to appropriate conditions, the thermosetting component capable of controllable degradation to release the chip die from the circuit board substrate, the chip die including electrical contacts in electrical engagement with the circuit board substrate, the electrical engagement achieved through bonding of the electrical contacts to the circuit board substrate through a fluxing agent, the fluxing agent being distinct from the heat curable underfill component and the thermosetting component.

A method for assembling an integrated circuit assembly is also provided, steps of which include:
  providing an integrated circuit chip;
  joining the integrated circuit chip with a carrier substrate to form a mated assembly; and
  exposing the so-formed mated assembly to elevated temperature conditions sufficient to render the electrical contacts cure the heat curable underfill composition, thereby establishing electrical interconnection in adhering the integrated circuit chip to the carrier substrate.

Alternatively to flowable electrical contacts and heat curable underfill compositions, in their stead one may use an anisotropically conductive adhesive composition or anisotropically conductive film to form an electrically connected joint. See e.g., U.S. Pat. Nos. 5,769,996, 5,851,644, 5,916, 641, 6,110,399, 6,149,857, 6,423,172 and 6,402,876.

A method for assembling an integrated circuit chip is provided too, steps of which include:
  providing a semiconductor chip having electrical contacts arranged in a predetermined pattern thereon;
  applying a fluxing agent over at least a portion of the electrical contacts; and
  dispensing a heat curable underfill composition in a flowable form on the semiconductor chip around the electrical contacts (or on a carrier substrate), the heat curable underfill composition being distinct from the fluxing agent.

In this aspect, when cured, the heat curable underfill composition has a ratio of modulus versus temperature between −65° C. and 125° C. in the range of −10 MPa/° C. to about 10 MPa/° C., such as about −7.5 MPa/° C.

In another aspect, the present invention provides a method of assembling a semiconductor device with improved reliability, such as where a semiconductor chip has a thickness of less than 100 microns and the bondline between the semiconductor device and the circuit board is less than 10 microns. Steps of this method include:
  providing a semiconductor chip having opposed surfaces, one of which for bonding to a carrier substrate and the other of which having electrical interconnections for establishing electrical interconnection therewith, and having a thickness of less than 100 microns;
  providing a carrier substrate having a portion of a surface for bonding the semiconductor chip and another portion of a surface for establishing electrical interconnection with the semiconductor chip;
  providing a heat curable die attach composition onto at least a portion of one or both of the bonding surface of the semiconductor chip or the bonding surface of the carrier substrate, in an amount sufficient to establish a bondline of less than about 10 microns when the semiconductor chip and the carrier substrate are mated;
  mating the bonding surface of the semiconductor chip with the bonding surface of the carrier substrate to form a semiconductor device assembly and exposing the semiconductor device assembly to elevated temperature conditions sufficient to cure the heat curable die attach composition, thereby bonding the semiconductor device to the carrier substrate; and
  establishing electrical interconnections between the semiconductor device and the carrier substrate.

This method also provides a semiconductor device, which includes:
  a semiconductor chip having opposed surfaces, one of which for bonding to a carrier substrate and the other of which having electrical interconnections for establishing electrical interconnection therewith, and having a thickness of less than 100 microns;
  a carrier substrate having a portion of a surface for bonding the semiconductor chip and another portion of a surface for establishing electrical interconnection with the semiconductor chip; and
  a die attach composition between the bonding surfaces of the semiconductor chip and the carrier substrate, to form a bond line of less than about 10 microns.

In this semiconductor device, the carrier substrate may be a circuit board.

In an alternative embodiment, a method of improving reliability of a semiconductor device comprising a semiconductor chip comprising at least one layer of low-k ILD is provided, steps of which include:
  providing a semiconductor device comprising:
    a first semiconductor chip comprising copper electrical interconnections and at least one layer of low-K ILD therewithin;

a second semiconductor chip (which may comprise copper electrical interconnections and at least one layer of low-K ILD therewithin) having opposed surfaces, one of which for bonding to a carrier substrate and the other of which for establishing electrical interconnection with both the first semiconductor chip and the carrier substrate; and a carrier substrate having electrical contact pads on a surface thereof to which the second semiconductor chip is electrically interconnected;

providing a die attach composition between the second semiconductor chip and carrier substrate;

providing a die attach composition between the first semiconductor chip and the second semiconductor chip to form a semiconductor device assembly; and exposing the semiconductor device assembly to conditions sufficient to cure the die attach composition.

In this embodiment, a semiconductor device is also provided, which includes:

a first semiconductor chip comprising copper electrical interconnections and at least one layer of low-K ILD therewithin;

a second semiconductor chip (which may comprise copper electrical interconnections and at least one layer of low-K ILD therewithin) having opposed surfaces, one of which for bonding to a carrier substrate and the other of which for establishing electrical interconnection with both the first semiconductor chip and the carrier substrate;

a carrier substrate having electrical contact pads on a surface thereof to which the second semiconductor chip is electrically interconnected;

a first die attach composition between the second semiconductor chip and carrier substrate; and a second die attach composition between the first semiconductor chip and the bonding surface of the second semiconductor chip to form a semiconductor device assembly.

In this aspect, the die attach composition has a ratio of modulus versus temperature between −65° C. and 125° C. in the range of −10 MPa/° C. to about 10 MPa/° C., such as about −7.5 MPa/° C.

In a further aspect, a method of improving reliability of a semiconductor device comprising at least one layer of low-K ILD is provided, steps of which include:

providing a semiconductor device comprising:

a semiconductor chip comprising copper electrical interconnections and at least one layer of low-K ILD therewithin; and a carrier substrate having electrical contact pads on a surface thereof to which the semiconductor chip is electrically interconnected;

providing a heat curable molding compound over the semiconductor device and exposing the semiconductor device to elevated temperature conditions sufficient to cure the heat curable molding compound.

This method yields an encapsulated semiconductor device, which includes:

a semiconductor device comprising:

a semiconductor chip having copper electrical interconnections and at least one layer of low-K ILD therewithin;

a carrier substrate having electrical contact pads on a surface thereof to which the semiconductor chip is electrically interconnected; and a cured molding compound thereover.

In this aspect, the molding compound has a ratio of modulus versus temperature between −65° C. and 125° C. in the range of −10 MPa° C. to about 10 MPa/° C., such as about −7.5 MPa/° C.

In these embodiments and aspects, the electrically conductive material may be solder, such as one having the following mixtures: Sn(63):Pb(37), Pb(95):Sn(5), Sn:Ag(3.5):Cu(0.5) or Sn:Ag(3.3):Cu(0.7).

Finally, the present invention provides a heat curable composition, suitable for use as an electronic packaging material, such as an underfill sealant, a die attach adhesive composition, a liquid encapsulant, and/or a molding compound, like an end cap encapsulant. The heat curable composition includes in one version an epoxy resin component and an anhydride component; in another version an epoxy resin component and a cationic curative; in yet another an epoxy resin component and a nitrogen-containing curative, such as an amine-containing compound, an amide-containing compound, an imidazole-containing compound and an aza-containing compound; and in yet another version a benzoxazine component, with or without a curative therefor.

The inventive compositions, when cured, thus exhibit the important performance properties of a coefficient of thermal expansion of less than about 25 ppm/° C. or a coefficient of thermal expansion of greater than about 50 ppm/° C., and a ratio of modulus versus temperature between −65° C. and 125° C. in the range of −10 MPa/° C. to about 10 MPa/° C., such as about −7.5 MPa/° C. These performance properties are particularly significant in semiconductor device packaging technology, such as where:

semiconductor chips with copper electrical interconnections and at least one layer of low-K ILD are used;

semiconductor chips that are relatively thin, such as less than 100 microns, compared to that of the current nominal thickness of about 350 microns are used; and chip attachment layers that are relatively thin, such as less than 10 microns, compared to that of the current nominal bond line thickness ("BLT") of 25 microns are used.

When semiconductor chips with copper interconnection and at least one layer of low-K ILD are used, this performance property improves reliability (i.e., prevents cracking in the ILD) in the assembled semiconductor device.

More specifically, in a flip chip package this performance property improves reliability when underfill sealant contacts the semiconductor chip constructed of copper interconnects and at least one layer of low-K ILD. In this way, the stresses on the semiconductor device are absorbed to a large extent by the underfill sealant, and thus the low-K ILD is preserved. Also, in a wire bonded stacked die package this performance property improves reliability when die attach material comes in contact with the surface of the semiconductor chip constructed of copper interconnects and at least one layer of low-K ILD. In addition, in a wire bonded stacked or single die package this performance property improves reliability when mold compound comes in contact with the semiconductor chip constructed of copper interconnects and at least one layer of low-K ILD. And, again in a wire bonded stacked or single die package this performance property improves reliability when encapsulant material comes in contact with the semiconductor chip constructed of copper interconnects and at least one layer of low-K ILD.

When semiconductor chips that are relatively thin, such as less than 100 microns, compared to that of the current nominal thickness of about 350 microns are used, this performance property improves reliability (i.e., prevents cracking in the low-K ILD or the semiconductor chip itself) in the assembled semiconductor device.

More specifically, in a flip chip package this performance property improves reliability as underfill sealant is intended to relieve die stresses, whether or not low-K ILD layer(s) are used in the package. Also, in a wire bonded die package this performance property improves reliability as die attach is intended to relieve die stresses, whether or not low-K ILD layer(s) are used in the package and whether or not a stacked die assembly is used.

When chip attachment layers that are relatively thin, such as less than 10 microns, compared to that of the current nominal BLT of 25 microns are used, this performance property improves reliability (i.e., reduces overall package stress and prevents cracking of the chip attachment layer) in the assembled semiconductor device.

More specifically, in a wire bonded die package this performance property improves reliability as die attach is intended to relieve die stresses due to the reduced BLT of less than 10 microns, whether or not low-K ILD layer(s) are used in the package and whether or not a stacked die assembly is used.

DETAILED DESCRIPTION OF THE INVENTION

Figure 1:
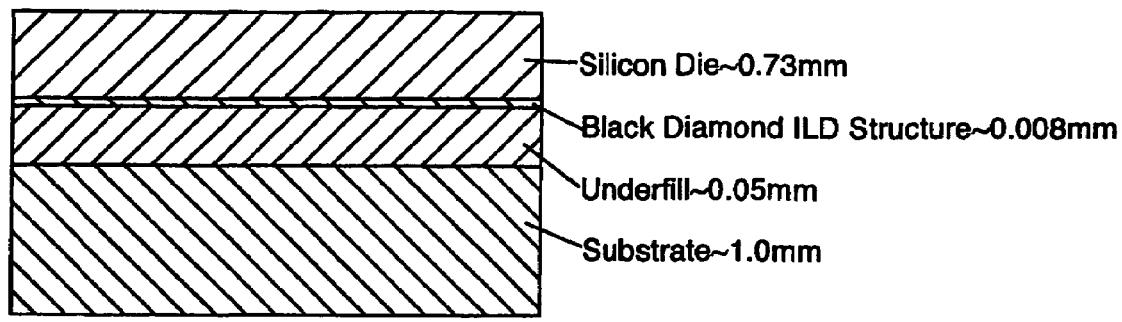
FIG. 1 depicts the separate components and physical dimensions of a conventional 0.130 um low-K die structure.
Figure 4:
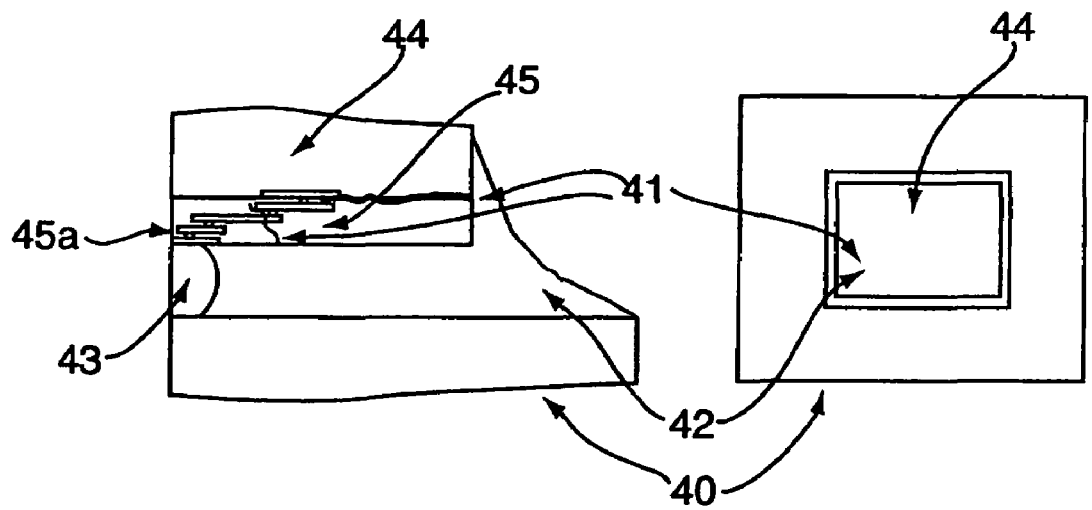
FIG. 4 depicts the failure mode of low-k ILD and copper interconnect-containing wafer on 0.13 um process, in which the lines 41 indicate cracks within the low-K/Cu structure of the die.
Figure 5:
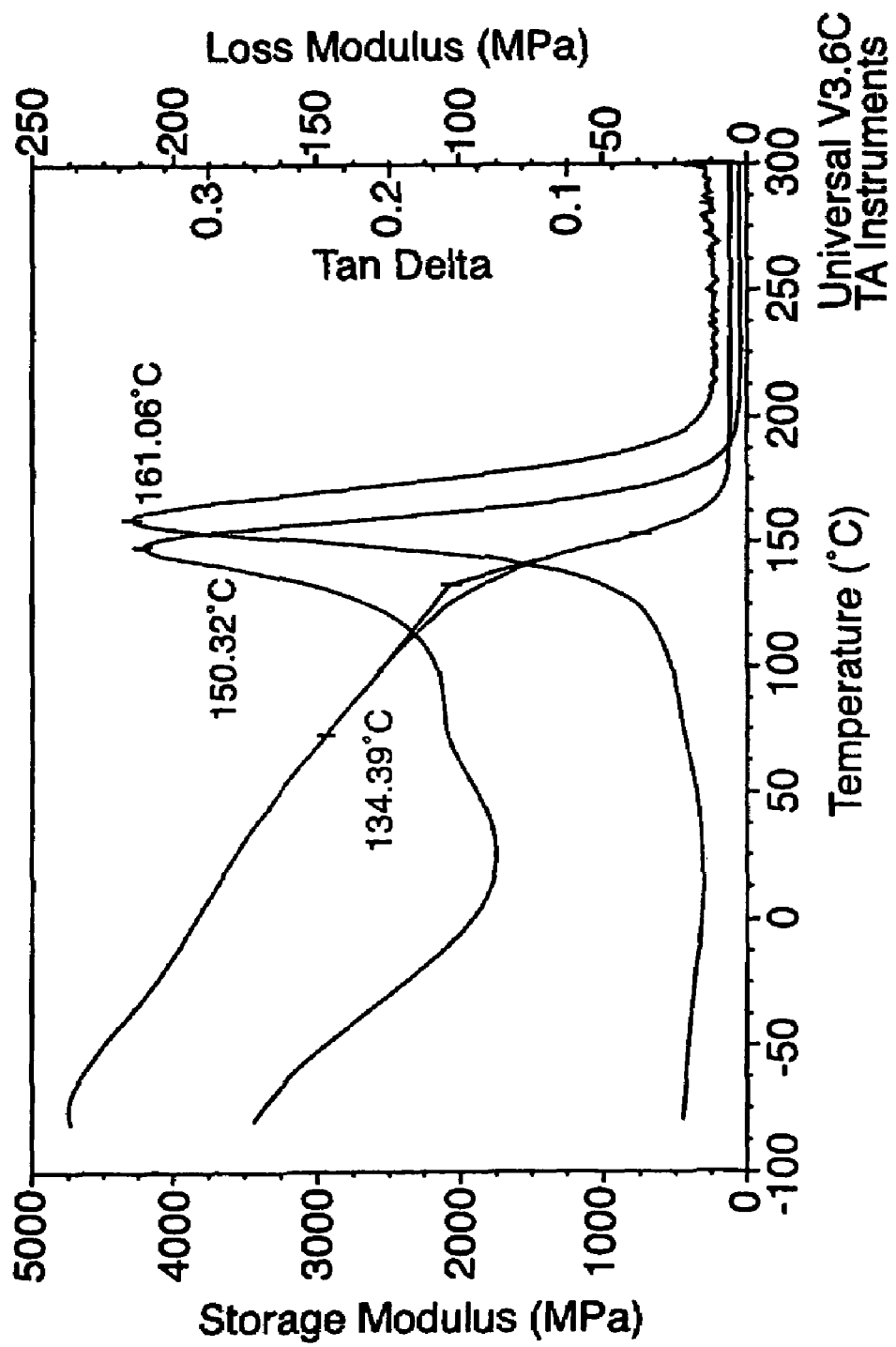
FIG. 5 depicts a modulus vs. temperature curve of a cationic curable epoxy composition, which shows conformance with a modulus of <10 MPa/° C. at a temperature between −60° C. and 125° C.
Figure 6:
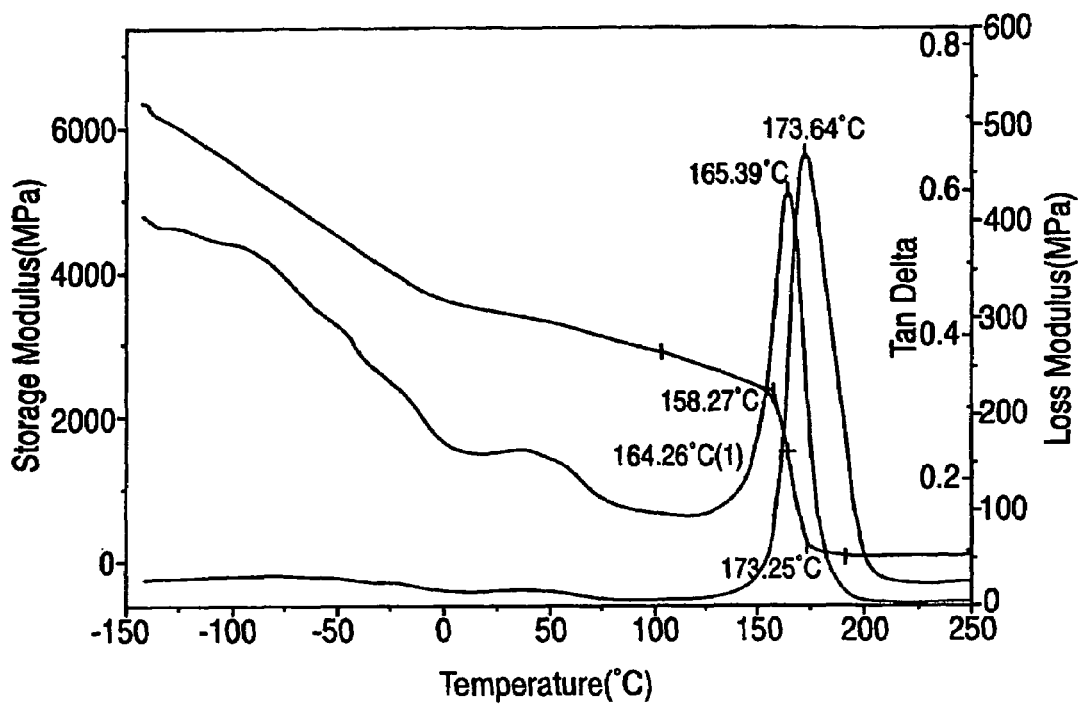
FIG. 6 depicts a modulus vs. temperature curve of an anhydride curable epoxy composition, which shows conformance with a modulus of <10 MPa/° C. at a temperature between −60° C. and 125° C.

FIG. 1 depicts the separate components and physical dimensions of a conventional 0.130 um low-K die structure, while FIG. 4 depicts the failure mode of low-k ILD and copper interconnect-containing wafer on 0.13 um process. More specifically, FIG. 4 shows the semiconductor device package 40, within which is underfill 42 and solder ball 43 semiconductor chip 44 contained the low-K ILD 45 having copper interconnects 45a and cracks 41 within the low-K ILD.

Figure 2:
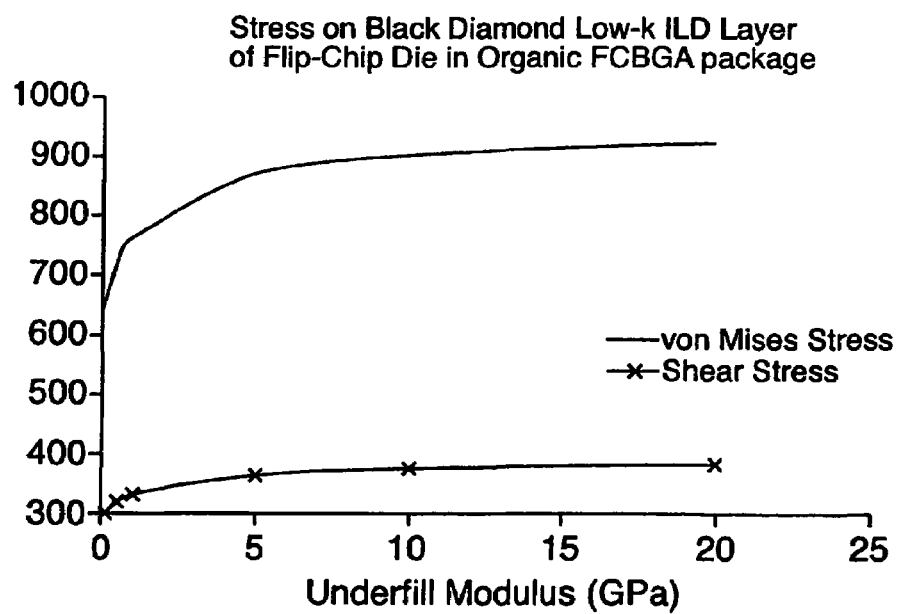
FIG. 2 depicts an x-y plot of stresses within an ILD-containing semiconductor device package as a function of underfill modulus.
Figure 3:
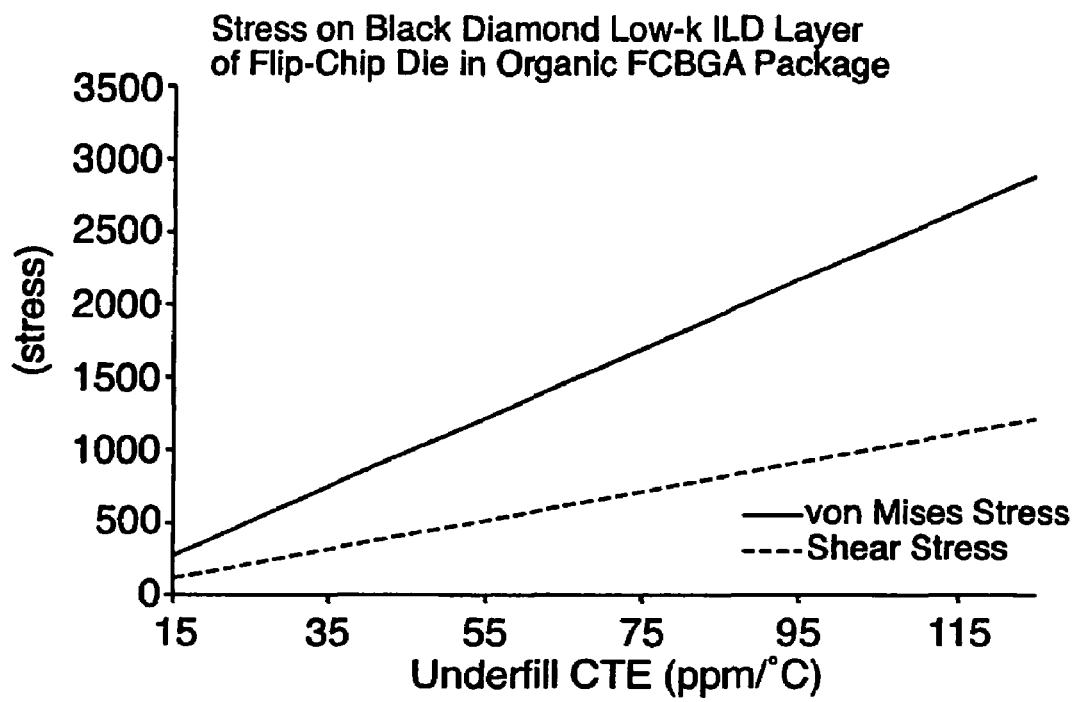
FIG. 3 depicts an x-y plot of stresses within an ILD-containing semiconductor device package as a function of underfill CTE.

Reference to FIGS. 2 and 3 illustrate the trends in the stresses encountered within the low-K ILD-containing semiconductor device package as a function of the modulus and CTE of the packaging material (underfill, encapsulant, mold compound, die attach and the like). These figures suggest that a reduction in either the CTE or modulus of the underfill material may significantly reduce the stresses encountered within the low-K ILD of the semiconductor device package.

However, in practice, since the CTE and modulus of the packaging material are inherently related, conscience adjustment of one of these material parameters will likely result in a change of the other. Therefore, while the stress trends shown in FIGS. 2 and 3 illustrate important relationships between the material properties and stresses within the low-K ILD-containing semiconductor device package, simply reducing the effective CTE or modulus of a packaging material had little or no effect on the overall stresses within the low-K ILD layers of the semiconductor device package, since a reduction in CTE results in a corresponding increase in modulus and vice versa. This is shown below in Table 1.

Multichip modules or stacked die structures are described, for instance, in U.S. Pat. No. 5,323,060 (incorporated by reference herein in its entirety), methods of preparation of which are described, for instance, in U.S. Pat. No. 5,286,679 (incorporated by reference herein in its entirety), preparation of semiconductor integrated circuit devices are described, for instance, in U.S. Pat. No. 5,140,404 (incorporated by reference herein in its entirety), preparation of semiconductor chip assemblies are described, for instance, in U.S. Pat. No. 6,465,893 (incorporated by reference herein in its entirety); each of which benefit from the present invention.

The die stacking may occur by way of a flip chip mounted on top of a wire bonded die; a wire bonded die mounted to the back side of a flip chip die; and a wire bonded die mounted to the active (metallized) surface of another wire bonded die.

Figure 8:
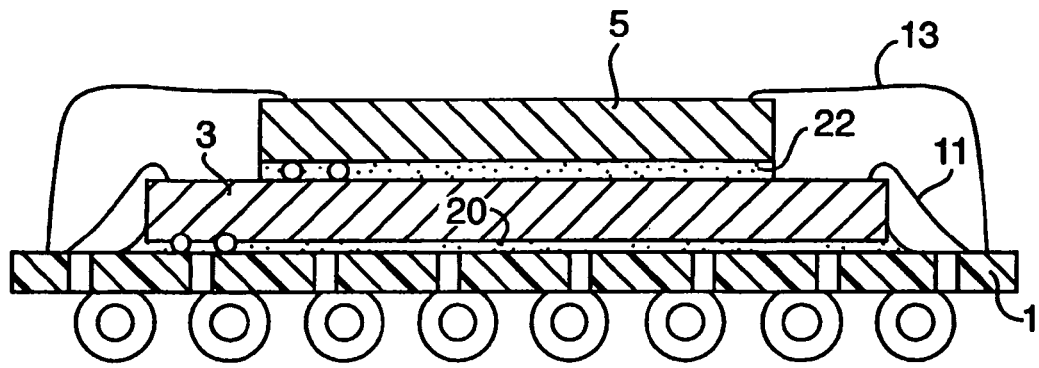
FIG. 8 is a cross-sectional view of one embodiment of a stacked die assembly prepared in accordance with the present invention.

For example, FIG. 8 illustrates a stacked structure where device 3 and device 5 are mounted on substrate 1, employing an adhesive as shown at 20 and/or 22 having the physical property profile described herein. Note that the presence of an organic spacer within the inventive electronic packaging material maintains a substantially constant bondline across the full dimension of the assembly. In the embodiment illustrated in FIG. 8, device 3 is smaller in dimension than device 5. As readily understood by those of skill in the art, additional devices could be mounted atop device 5, thereby providing an even higher density product.

Figure 9:
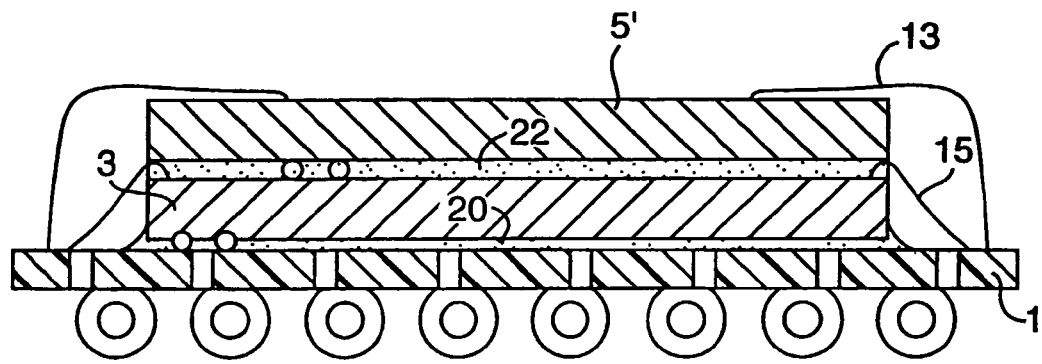
FIG. 9 is a cross-sectional view of another embodiment of a stacked die assembly prepared in accordance with the present invention.

As another example, FIG. 9 illustrates a stacked assembly where the multiple devices stacked onto the substrate are all substantially the same size. Thus, the inventive electronic packaging material employed between device 3 and 5' can fill only the space between the two devices being mounted, not including the wire bond 15, or alternatively, the inventive electronic packaging material can completely fill the space between the two devices, including the wire bond 15. In this way, additional protection can be provided to the wire bond structure.

Figure 7:
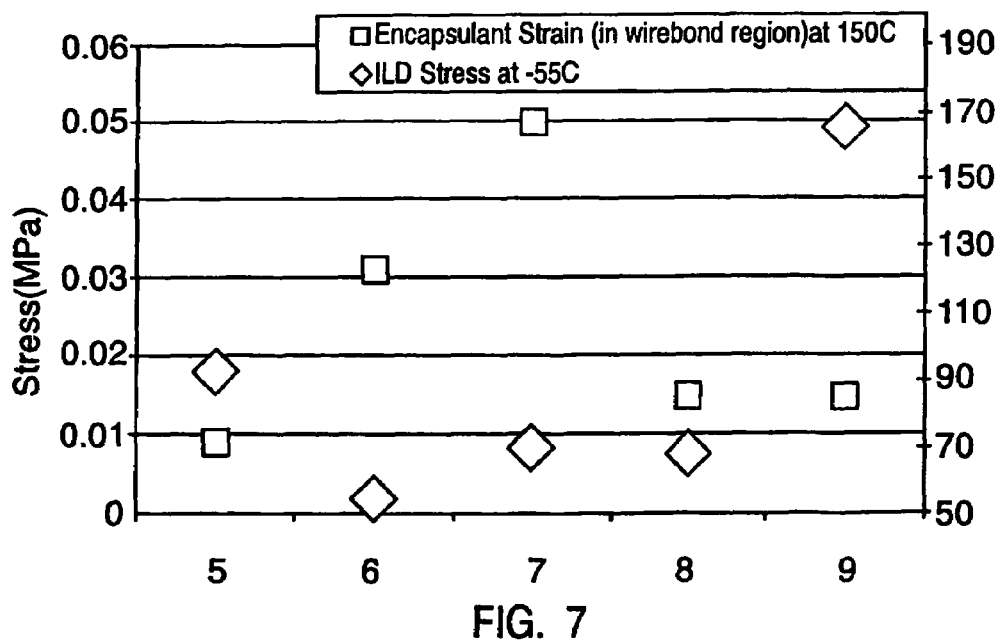
FIG. 7 depicts a chart showing the stresses on a low-k die structure, and the strain on interconnections for the die in the structure for each of Sample Nos. 5-9.
Figure 10:
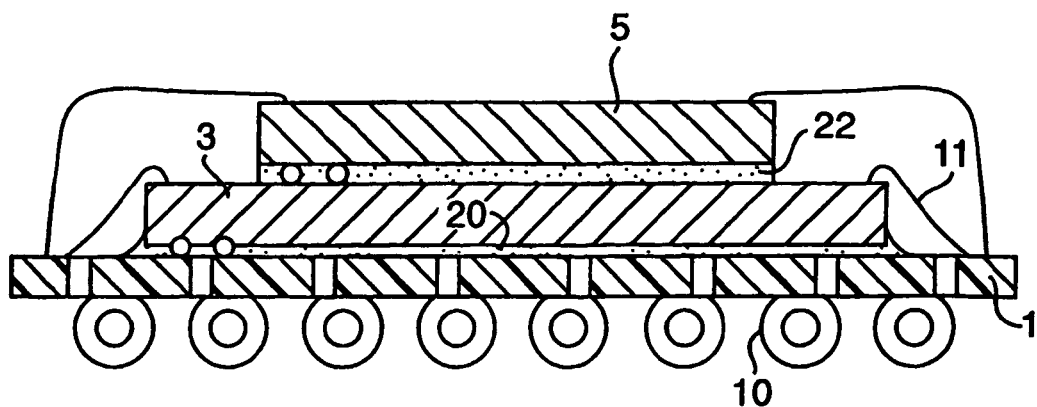
FIG. 10 is a cross-sectional view of yet another embodiment of a stacked die assembly prepared in accordance with the present invention.

As yet another example, FIG. 10 illustrates a stacked die assembly where a flipped chip 11 serves as the substrate, making electrical contact with the remainder of the device through solder bumps 10. The remainder of the assembly can be prepared in a variety of ways, for example, as shown in FIGS. 7 and 8. For simplicity, the same format for devices 3 and 5 is shown here as is illustrated in FIG. 7.

Electronic packaging materials according to the present invention optionally include at least one filler. Fillers contemplated for optional use in the practice of the present invention are other than the spacers and may optionally be conductive (electrically and/or thermally). Electrically conductive fillers contemplated for use in the practice of the present invention include, for example, silver, nickel, gold, cobalt, copper, aluminum, graphite, silver-coated graphite, nickel-coated graphite, alloys of such metals, and the like, as well as mixtures thereof. Both powder and flake forms of filler may be used in the adhesive compositions of the present invention. Preferably, the flake has a thickness of less than about 2 microns, with planar dimensions of about 20 to about 25 microns. Flake employed herein preferably has a surface area of about 0.15 to 5.0 $m^2/g$ and a tap density of about 0.4 up to about 5.5 g/cc. It is presently preferred that powder employed in the practice of the invention has a diameter of about 0.5 to 15 microns. If present, the filler typically comprises in the range of about 1% up to about 95% by weight of the electronic packaging material.

Thermally conductive fillers contemplated for optional use in the practice of the present invention include, for example, boron nitride, silicon carbide, diamond, graphite, beryllium oxide, magnesia, silica, alumina, and the like. The particle size of these fillers will be in the range of about 0.5 microns up to about 25 microns. Preferably, the particle size is about 20 microns.

Electrically and/or thermally conductive fillers are optionally (and preferably) rendered substantially free of catalytically active metal ions by treatment with chelating agents, reducing agents, non-ionic lubricating agents, or mixtures of such agents. Such treatments are described in U.S. Pat. No. 5,447,988, which is incorporated by reference herein in its entirety.

Optionally, a filler may be used that is neither an electrical nor a thermal conductor. Such fillers may be desirable to impart some other property to the adhesive formulation such as, for example, reduced thermal expansion of the cured adhesive, reduced dielectric constant, improved toughness, increased hydrophobicity, and the like. Examples of such fillers include fluorinated hydrocarbon polymers (e.g., TEFLON™), thermoplastic polymers, thermoplastic elastomers, mica, fused silica, glass powder, and the like.

In particular, the BLT may be determined by the use of spacers having a selected dimension.

Devices contemplated for use in the practice of the present invention include any surface mount component such as, for example, semiconductor die (e.g., wire bonded, flipped chip, and the like), resistors, capacitors, and the like. Preferably, devices contemplated for use in the practice of invention methods are semiconductor dies. Substrates contemplated for use include metal substrates (e.g., lead frames) and organic substrates (e.g., laminates, ball grid arrays, polyamide films, and the like).

EXAMPLES

Sample No. 1, which is used for comparative purposes, is an epoxy-based underfill material available commercially from Henkel Corporation, City of Industry, Calif. Sample Nos. 2-4 were evaluated for their performance, as were Sample Nos. 6-8. Sample Nos. 5 and 9 were used for comparative purposes, though as encapsulants as they too are available commercially from Henkel Corporation.

Sample Nos. 1-9 are set forth below in Tables 1a and 1b.

TABLE 1a

| Components | Sample Nos./Amt. (Wt. %) | | | |
|---|---|---|---|---|
| | 1 | 2 | 3 | 4 |
| Epoxy Resin | 12.4 | 15.4 | 15.0 | 44.5 |
| Epoxy Toughener | 12.0 | 15.0 | 9.0 | 10.0 |
| MHHPA Hardener | 24.0 | 28.0 | — | — |
| Amine Hardener | — | — | 15.0 | 44.5 |
| Alumina Filler | 50.0 | 40.0 | — | — |
| Silica Filler | — | — | 60.0 | — |
| Imidazole Catalyst | 0.60 | 0.60 | — | — |
| Black Pigment | 0.50 | 0.50 | 0.50 | 0.50 |
| Silane Adhesion Promoter | 0.50 | 0.50 | 0.50 | 0.50 |

TABLE 1b

| Components | Sample Nos./Amt. (Wt. %) | | | | |
|---|---|---|---|---|---|
| | 5 | 6 | 7 | 8 | 9 |
| Epoxy Resin | 12.3 | — | 24.5 | 20.0 | 6.25 |
| Epoxy Toughener | 4.0 | 14.5 | — | 20.0 | — |
| MHHPA Hardener | 12.2 | 14.0 | — | 38.0 | 6.25 |
| Amine Hardener | — | — | — | — | — |
| Phenolic Hardener | — | — | 24.5 | — | — |
| Alumina Filler | — | — | — | 20.0 | — |
| Silica Filler | 70.0 | 60.0 | 50.0 | — | 86.0 |
| Imidazole Catalyst | 0.50 | 0.50 | — | 1.0 | 0.5 |
| Black Pigment | 0.50 | 0.50 | 0.50 | 0.5 | 0.5 |
| Silane Adhesion Promoter | 0.50 | 0.50 | 0.50 | 0.5 | 0.5 |

The properties of each of these samples are shown in Tables 2a and 2b.

TABLE 2a

| Physical Properties | Sample Nos. | | | |
|---|---|---|---|---|
| | 1 | 2 | 3 | 4 |
| Specific Gravity | 1.8 | 1.6 | 1.7 | 1.2 |
| Viscosity (25° C. CP52/20) | 2500 | 2000 | 25000 | 8000 |
| Gel Time (121° C., minutes) | 13 | 12 | — | 32 |
| Pot life (25° C., hours) | 24 | 24 | 12 | 24 |
| Shelf Life (−40° C., months) | 9 | 9 | 9 | 9 |
| Cure Time (min.) | 30 | 30 | 120 | 60 + 60 |
| Cure Temperature | 165° C. | 165° C. | 165° C. | 13° C. + 165° C. |
| Filler Type | Alumina | Alumina | Silica | — |
| Maximum Filler Size (microns) | 5 | 5 | 12 | — |
| Average Filler Size (microns) | 1 | 1 | 3 | |
| CTE α1 (ppm/° C.) | 45 | 51 | 37 | 60 |
| CTE α2 (ppm/° C.) | 143 | 143 | 105 | 200 |
| Filler Weight (%) | 50 | 40 | 60 | 0 |
| Tg (° C.) by TMA | 140 | 150 | 50 | 65 |
| Flexural Modulus @25° C. (GPa) | 5.6 | 4.5 | 3.9 | 2.4 |
| Flexural Strength (MPa) | 100 | — | 50 | 110 |

TABLE 2b

| Physical Properties | Sample Nos. | | | | |
|---|---|---|---|---|---|
| | 5 | 6 | 7 | 8 | 9 |
| CTE α1 (ppm/° C.) | 19 | 35 | 47 | 48 | 9 |
| CTE α2 (ppm/° C.) | 71 | 143 | 180 | 155 | 41 |
| Tg (° C.) by TMA | 160 | 10 | 55 | 160 | 160 |
| Modulus-1 (GPa) | 11.4 | 6.8 | 4.3 | 4.0 | 25 |
| Modulus-2 (GPa) | 0.503 | 0.014 | 0.013 | 0.058 | 0.250 |
| Stress on low-K die structure (MPa) | 88 | 55 | 67 | 67 | 165 |
| Strain on interconnector of die (microns) | 10 | 32 | 50 | 16 | 16 |

In Table 2b, the lowest CTE material (Sample No. 9) has a very high stress (165 MPa) due to its high modulus and one of the lowest modulus materials (Sample No. 6) has a relatively higher strain (32 microns) due to its high CTE.

The samples illustrated in Tables 1a and 1b show that an electronic packaging material (here, an underfill or an encapsulant) having a combination of low CTE and low modulus can significantly reduce the stresses within a low-K ILD-containing semiconductor device package. For example, a composition within the scope of the invention, having a CTE (α1) of 48 ppm/° C. and a modulus of 4.0 Gpa (Sample No. 8) creates stresses within the low-K ILD-containing structure that are nearly 20% lower than those created by a conventional electronic packaging material (Sample No. 5).

As an example of a cationically curable epoxy composition (Sample No. 10) within the scope of the invention, the following components in the amounts noted in Table 3 were mixed together:

TABLE 3

| Components | Desirable Range | Amt. (Wt. %) |
|---|---|---|
| Bisphenol-A Epoxy Resin | 10-90 | 36.60 |
| Epoxy Toughener | 0-40 | 10.00 |
| Cationic Catalyst | 0.1-2.5 | 1.50 |
| Silica Filler | 0-70 | 20.00 |
| CuAcAc | 0-1 | 0.30 |
| Black Pigment | 0-5 | 0.60 |
| Silane Adhesion Promoter | 0-5 | 1.00 |

Bisphenol-A epoxy resin is an example of an epoxy resin that may be used, as other epoxy resins can form a cured polymer with a Tg greater than 125° C. Whether to use the epoxy toughener, and the level at which it is used, is only limited by the ultimate Tg desired for the cured composition. Too much toughener will reduce the Tg of the cured composition greater than 125° C. Some tougheners may also change the modulus of the cured composition to an extent that is no longer desirable. Silica filler may not be desired for all applications, and as such is an optional component. CuAcAc is used where a lower temperature cure is desired, and as such is an optional component as well.

As an example of an anhydride curable epoxy composition (Sample No. 11) within the scope of the invention, the following components in the amounts noted with mixed together:

TABLE 4

| Components | Desirable Range | Amt. (Wt. %) |
|---|---|---|
| Bisphenol-A Epoxy Resin | 10-90 | 19.73 |
| Epoxy Toughener | 0-40 | 19.73 |
| Defoamer | 0-1 | 0.10 |
| Wetting Agent | 0-2 | 0.12 |
| Silane Adhesion Promoter | 0-2 | 0.40 |
| Silica Filler | 0-70 | 20.05 |
| Imidazole Catalyst | 0-2 | 1.06 |
| MHHPA | 4-50 | 38.81 |

Sample Nos. 10 and 11 demonstrated the following physical properties listed in Table 5 at a 20% filler load:

TABLE 5

| Physical Properties | Sample No. | |
|---|---|---|
| | 10 | 11 |
| Viscosity, cps | 30,000 | 900 |
| Tg, ° C. | 140 | 150 |
| CTE, ppm/° C. | 50 | 60 |
| E, GPa @ 25° C. | 3.6 | 3.5 | where E is elastic modulus.

Sample Nos. 1-4 were evaluated as flip chip underfill compositions in ILD-containing semiconductor device packages. The ILD-containing semiconductor device packages were assembled from:

35 mm×35 mm×1.0 mm BT substrate, Taiyo PSR-4000-AUS5 soldermask 15 mm×15 mm silicon test die with 3-layer Black Diamond ILD structure silicon nitride passivation 225 µm pitch full array bump pattern each of Sample Nos. 1-4 was dispensed onto preheated assemblies at a temperature of 110° C. using a single-line dispense pattern with no seal pass. Each sample flowed easily and formed fillets along all edges of the die with greater than 90% die edge coverage.

These assemblies were then exposed to appropriate conditions to cure each of Sample Nos. 1-9 and evaluated for delamination/voiding analysis by acoustic microscopy ("CSAM"), results for Sample Nos. 1-4 are reported below in Table 6.

TABLE 6

| Sample No. | CSAM | |
|---|---|---|
| | After Dispense/Cure | After Thermal Cycle |
| 1 | small dispense void | ILD delamination cracking |
| 2 | no problems | No problems |
| 3 | no problems | Corner/edge solder joint opens |
| 4 | no problems | Corner/edge solder joint opens |

Sample No. 1 exhibited corner delamination and solder ball cracking after air-air thermal cycling. Sample Nos. 3 and 4 exhibited solder joint fatigue failure along the edges and corners of the devices after air-air thermal cycling as evidenced by the CSAM analysis.

Sample No. 2 appears to be unchanged with respect to delamination after these evaluations.

The present invention in its underfill form provides materials having significantly reduced stresses compared to conventional capillary underfill materials. To this end, conventional underfill materials having low CTE and relatively high modulus create significant stresses within the low-K ILD-containing semiconductor device which leads to delamination and cracking. And, unfilled, low CTE underfill materials (having a modulus less than about 3 GPa) create significant stresses within the solder joints which lead to premature solder joint fatigue.

Based on this information, it seems that Sample No. 2, having a moderate modulus (between about 3 GPa and 5 GPa) and conforming to a modulus of −7.5 MPa/° C. as a function of temperature average in the range of −65° C. to 125° C., performs better than Sample Nos. 1, 3 and 4 on Black Diamond low-K ILD-containing flip chip assemblies.

Figure 11:
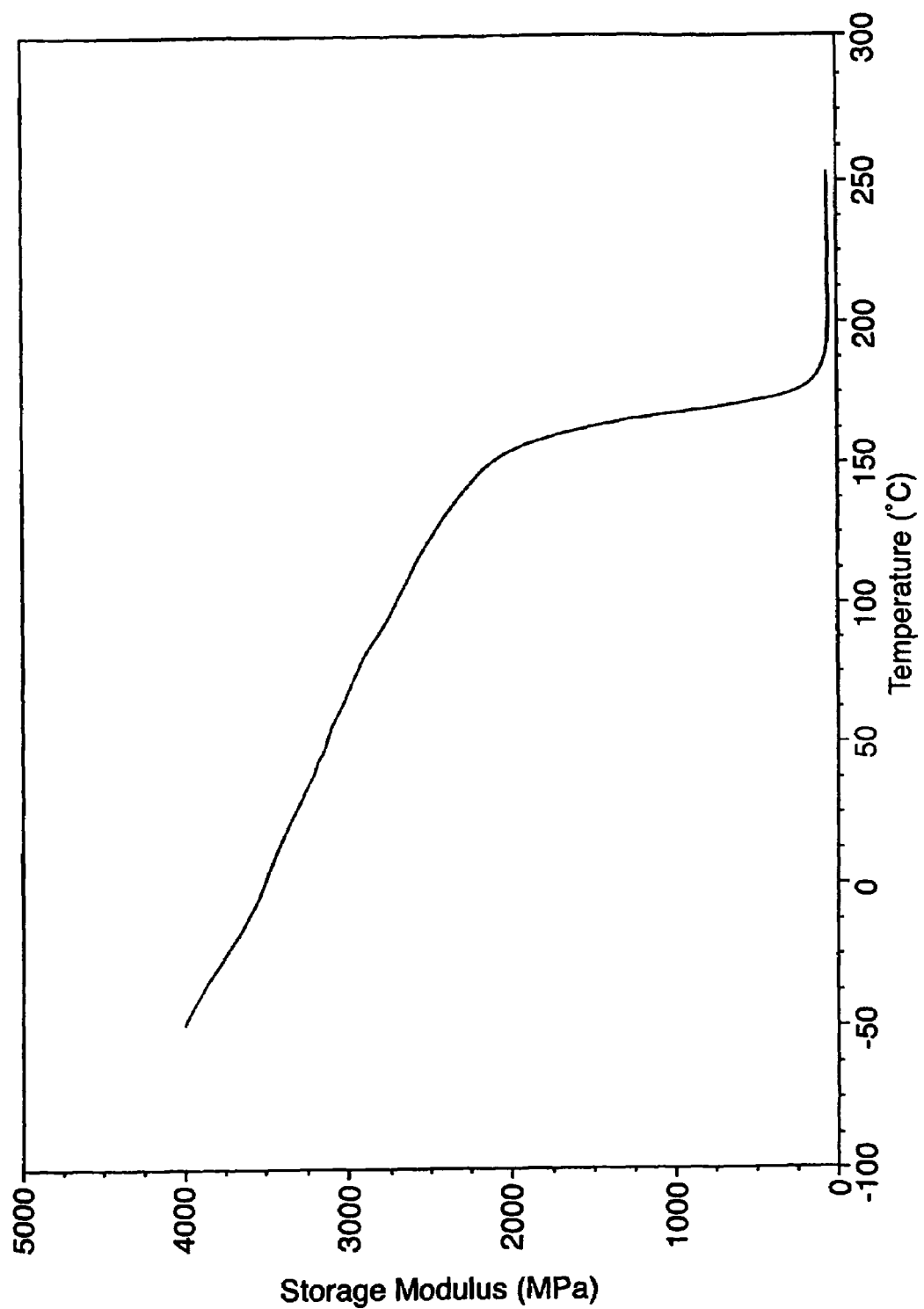
FIG. 11 depicts a modulus vs. temperature curve of a heat curable composition within the scope of the invention (Sample No. 8), which shows conformance with a modulus of <10 MPa/° C. at a temperature between −60° C. and 125° C.

Results for Sample Nos. 5-9 are shown in FIG. 7, from which it is seen that Sample No. 8 among Sample Nos. 5-9 has the overall best combination of low ILD stress and low strain. That is, Sample No. 8 exhibits a change in modulus as a function of temperature within the range of the invention—specifically −8.5 MPa/° C. (See FIG. 11).

What is claimed is:

1. A method of improving reliability of a semiconductor device comprising at least one layer of low-K ILD, steps of which comprise:

providing a semiconductor device comprising:
 a semiconductor chip comprising copper electrical interconnections and at least one layer of low-K ILD therewithin and metallization on a surface thereof; and
 a carrier substrate having electrical contact pads on a surface thereof to which the semiconductor chip is electrically interconnected through an electrically conductive material to the copper electrical interconnections; and
 optionally, a second semiconductor chip having opposed surfaces, one of which for bonding to the carrier substrate and the other of which for establishing electrical interconnection with both the semiconductor chip and the carrier substrate, wherein the carrier substrate has electrical contact pads on a surface thereof to which at least one of the semiconductor chip or the second semiconductor chip is electrically interconnected;

providing a heat curable composition either between the electrically interconnected surfaces of the semiconductor chip and the carrier substrate to form a semiconductor device assembly and/or over the semiconductor device assembly; and exposing the semiconductor device assembly to elevated temperature conditions sufficient to cure the heat curable composition, wherein the heat curable composition comprises a curable resin component and a filler component, wherein the filler component is present in an amount sufficient to provide the heat curable composition when cured with a coefficient of thermal expansion of less than about 25 ppm/° C. or a coefficient of thermal expansion of greater than about 50 ppm/° C. and when cured the heat curable composition has a ratio of modulus versus temperature between −65° C. and 125° C. in the range of 10 MPa/° C. to about −10 MPa/° C.

2. The method of claim 1, wherein the electrically conductive material is solder.

3. The method of claim 2, wherein the solder is selected from the group consisting of Sn(63):Pb(37), Pb(95):Sn(5), Sn:Ag(3.5):Cu(0.5) and Sn:Ag(3.3):Cu(0.7).

4. An underfilled semiconductor device assembly comprising:

Either a semiconductor chip comprising copper electrical interconnection and the layer of low-K ILD therewithin and metallization on a surface thereof or a semiconductor device comprising a semiconductor chip comprising copper electrical interconnection thereof contacting at least one layer of low-K ILD therewithin and metallization on a surface thereof to which is electrically connected a carrier substrate;

a circuit board having electrical contact pads on a surface thereof to which the semiconductor chip or semiconductor device, respectively, is electrically interconnected; and a heat curable underfill composition between the semiconductor chip or semiconductor device, respectively, and the circuit board, wherein the heat curable underfill composition comprises a curable resin component and a filler component, wherein the filler component is present in an amount sufficient to provide the heat curable underfill composition when cured with a coefficient of thermal expansion of less than about 25 ppm/° C. or a coefficient of thermal expansion of greater than about 50 ppc/° C., and wherein the heat curable underfill composition has a ratio of modulus versus temperature between −65° C. and 125° C. in the range of −10 MBa/° C. to about 10 MPa/° C.

5. The device of claim 4, wherein the electrically conductive material is solder.

6. The method of claim 5, wherein the solder is selected from the group consisting of Sn(63):Pb(37), Pb(95):Sn(5), Sn:Ag(3.5):Cu(0.5) and Sn:Ag(3.3):Cu(0.7).

7. A method of assembling a semiconductor device with improved reliability, steps of which comprise:

providing a semiconductor chip having opposed surfaces, one of which for bonding to a carrier substrate and the other of which having electrical interconnections for establishing electrical interconnection therewith, and having a thickness of less than 100 microns;

providing a carrier substrate having a portion of a surface for bonding the semiconductor chip and another portion of a surface for establishing electrical interconnection with the semiconductor chip;

providing a heat curable die attach composition onto at least a portion of one or both of the bonding surface of the semiconductor chip or the bonding surface of the carrier substrate, in an amount sufficient to establish a bondline of less than about 10 microns when the semiconductor chip and the carrier substrate are mated;

mating the bonding surface of the semiconductor chip with the bonding surface of the carrier substrate to form a semiconductor device assembly and exposing the semiconductor device assembly to elevated temperature conditions sufficient to cure the heat curable die attach composition, thereby bonding the semiconductor device to the carrier substrate; and establishing electrical interconnections between the semiconductor device and the carrier substrate, wherein when cured the heat curable die attach composition has a ratio of modulus versus temperature between −65° C. and 125° C. in the range of −10 MPa/° C. to about −10 MPa/° C.

8. The method of claim 7, wherein the heat curable die attach composition comprises a curable resin component and a tiller component, wherein the filler component is present in an amount sufficient to provide the hear curable die attach composition when cured with a coefficient of thermal expansion of less than about 25 ppm/° C. or a coefficient of thermal expansion of greater than about 50 ppm/° C.

9. A semiconductor device comprising:
- a semiconductor chip having opposed surfaces, one of which for bonding to a carrier substrate and the other of which having electrical interconnections for establishing electrical interconnection therewith, and having a thickness of less than 100 microns;
- a carrier substrate having a portion of a surface for bonding the semiconductor chip and another portion of a surface for establishing electrical interconnection with the semiconductor chip; and
- a die attach composition between the bonding surfaces of the semiconductor chip and the carrier substrate, to form a bond line of less than about 10 microns, wherein the die attach composition has a ratio of modulus versus temperature between −65° C. and 125° C. in the range of 10 MPa/° C. to about 10 MPa/° C.

10. The method of claim 7, wherein the electrical interconnection is established through an electrically conductive material.

11. The method of claim 10, wherein the electrically conductive material is solder.

12. The method of claim 11, wherein the solder is selected from the group consisting of Sn(63):Pb(37), Pb(95):Sn(5), Sn:Ag(3.5):Cu(0.5) and Sn:Ag(3.3):Cu(0.7).

\* \* \* \* \*